July 14, 1953 E. O. KEIZER 2,645,718

VARIABLE INDUCTANCE STRUCTURE

Filed June 6, 1950 2 Sheets-Sheet 1

INVENTOR
Eugene O. Keizer
BY H. W. Newton
ATTORNEY

July 14, 1953 E. O. KEIZER 2,645,718

VARIABLE INDUCTANCE STRUCTURE

Filed June 6, 1950 2 Sheets-Sheet 2

INVENTOR
Eugene O. Keizer
BY H. L. Newton
ATTORNEY

Patented July 14, 1953 2,645,718

UNITED STATES PATENT OFFICE 2,645,718

VARIABLE INDUCTANCE STRUCTURE

Eugene O. Keizer, Princeton, N. J., assignor to Radio Corporation of America, a corporation of Delaware Application June 6, 1950, Serial No. 166,428

6 Claims. (Cl. 250—40)

This invention relates to variable inductance structures and more particularly to a variable inductor suitable to provide a high-frequency tuner for radio and other electrical circuits and tunable over an extended high-frequency range.

At the present time, several channels have been allocated for the purpose of broadcasting television images in black and white. These television channels are within the frequency bands from 54 to 88 mc. (megacycles) and from 174 to 216 mc. Thus, for the reception of such television images these two widely separated frequency ranges must be covered by a high-frequency tuner forming part of a television receiver. It is expected that in the future television images will be transmitted over a still higher frequency range. At the present time, the frequency band between 490 and 700 mc. has been reserved for experimental purposes in connection with color television. It is accordingly desirable to provide a single high-frequency tuner which will cover, for example, these three widely spaced high-frequency ranges. Such a high-frequency tuner may be designed to operate in the manner of a spread-band tuner whereby a desired frequency range is expanded or spread out while intermediate, undesired frequency ranges are compressed. The present invention provides a variable inductance structure which will permit tuning of such widely spaced frequency ranges between approximately 50 and more than 700 mc.

It is accordingly an object of the present invention to provide a variable inductance structure for varying the tuning response of an electrical circuit over a wide frequency range such as, for example, between approximately 50 and over 700 mc.

A further object of the invention is to provide a variable inductance structure where equal movements of a movable element will result in either a rapid or a slow variation of the inductance of the structure whereby the structure may be used in an electrical circuit to spread out a desired frequency range while an undesired frequency range may be compressed.

Another object of the invention is to provide a variable inductance structure having terminals arranged in such a manner that the structure may be connected, for example, to a vacuum tube or to other circuit elements by very short leads, thereby to reduce stray capacitance and inductance which may be present at high frequencies when long connecting leads have to be used.

A variable inductance structure for varying the tuning response of an electrical circuit over a relatively wide high-frequency range in accordance with the invention comprises a pair of inductors. The inductance of sections of equal length of each inductor varies in a predetermined manner along the length of the inductor. A single metallic slider is disposed about a portion of each inductor and is spaced therefrom by a dielectric layer which may, for example, be provided on each inductor. Thus, a capacitance is provided between the slider and each of the inductors. The slider is movable with respect to the inductors to vary the inductance existing between one end of each inductor and the slider. Electrical terminals may be connected to one end of each inductor for connection to an electrical circuit. Thus, if a capacitance is provided between the two terminals, a parallel resonant circuit is obtained, the resonant frequency of which may be varied by movement of the slider.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
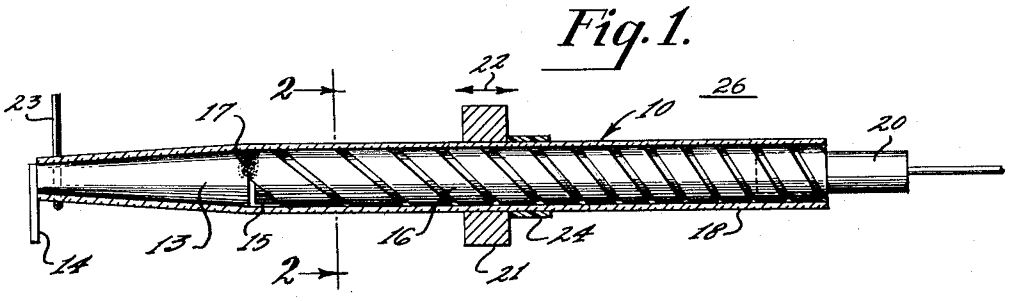
Figure 1 is an elevational view, partly in section, of a variable inductance structure embodying the present invention and suitable to provide a high-frequency tuner.
Figure 2:
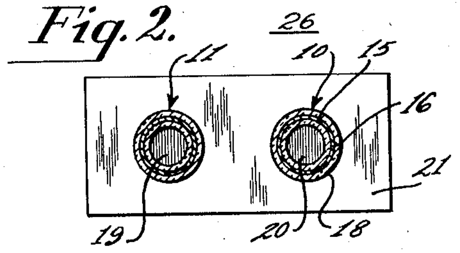
Figure 2 is a cross-sectional view of the structure of Figure 1 taken on line 2—2 of Figure 1.
Figure 6:
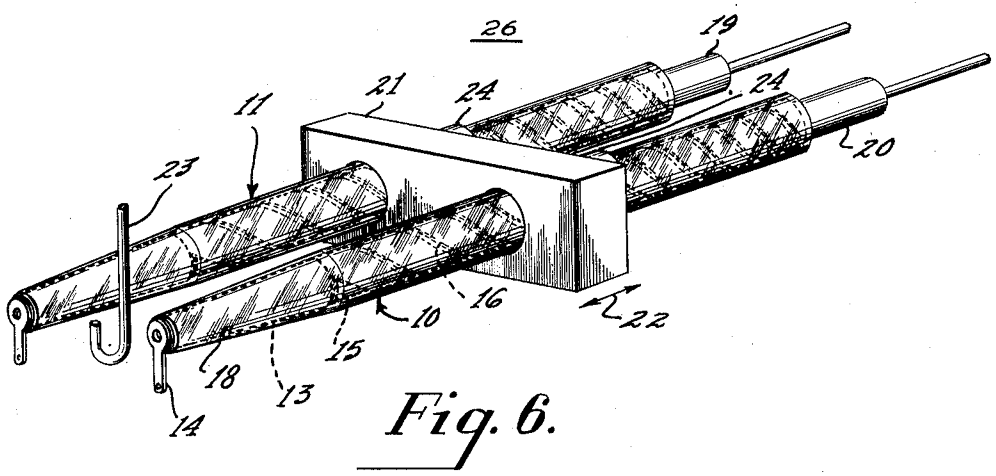
Figure 6 is a perspective view of the tuner shown in Figures 1 and 2 for more clearly illustrating the relationship of the various elements of the invention.

Referring now to the drawing, in which like components are designated by the same reference numerals, and particularly to Figures 1, 2 and 6 there is illustrated a variable inductance structure 26 in accordance with the invention. The variable structure includes a pair of inductors generally indicated at 10 and 11 (Figures 2 and 6). The two inductors 10 and 11 are of the same construction and one of them is shown in detail in Figure 1. Thus, inductor 10 includes a metallic rod 13 which may be solid and which may be tapered towards its free end as shown. Terminal 14 is electrically connected to the smaller end of rod 13.

A hollow support 15 is mechanically secured to rod 13. Support 15 consists of a suitable insulating material. A metallic ribbon 16 is disposed spirally about support 15 and is electrically connected to rod 13, for example, by solder indicated at 17. Preferably, the width and pitch of ribbon 16 is largest near rod 13 and decreases towards its free end at the right of Figure 1. A dielectric layer 18 may be disposed about ribbon 16 and rod 13. Layer 18 may, for example, consist of polystyrene. A core 20 of a suitable ferromagnetic material such, for example, as a powdered iron core may be disposed within support 15. A similar core 19 may be provided in inductor 11 (Figure 2). Core 20 serves to increase the inductance of a particular portion of inductor 10. It is to be understood that more than one core 20 may be provided, if desired.

A metallic slider or bridge element 21 is provided which surrounds a short axial length of both inductors 10 and 11. Slider 21 is movable with respect to inductors 10 and 11 as indicated by arrow 22. A capacitive pickup element 23 of a radio signal may be disposed about inductor 10. For some applications such as, for example, a push-pull mixer circuit a separate pickup element may be coupled to each inductor 10 and 11. It is also feasible to provide a cylindrical portion 24 which is secured to slider 22 and which extends between the slider and the free end of each inductor 10 and 11. Cylinders 24 may, for example, be made of a high-loss magnetic material such as magnetite or ferrite which have a comparatively high magnetic loss at frequencies of 50 mc. or more. Instead of providing a dielectric layer 18 about core 13 and ribbon 16, such a layer may be provided in the openings of slider 21.

The operation of the structure of Figures 1, 2 and 6 will now be evident. The position of slider 21 determines the inductance existing between the slider and terminals 14. The rate of change of the inductance with the movement of slider 21 is determined by the pitch and width of ribbon 16. This relationship may be adjusted by proper positioning of ferromagnetic core 20 or by providing more than one core within support 15. Cylinders 24 serve the purpose of rendering ineffective the portions of inductors 10 and 11 existing between slider 21 and the free ends of the inductors. It will also be understood that the inductance of the structure is smallest when slider 21 is moved to the left and increases when the slider is moved towards the right.

Figure 3:
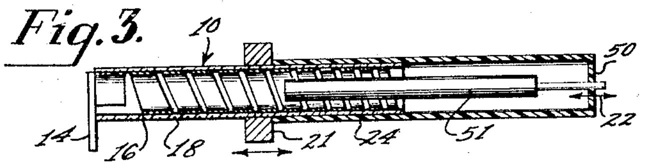
Figure 3 is a sectional view of a modified inductance structure in accordance with the invention.

In order to render effective the unused portions of inductors 10 and 11 which exist between the slider 21 and the free ends of the inductors it is also feasible to utilize the structure illustrated in Figure 3. Cylinder or shell 24 completely surrounds inductor 10 and may also surround inductor 11 and preferably has a closed end portion indicated at 50. Cylinder 24 again consists of a material having high magnetic loss such as ferrite, magnetite or Bakelite. Cylinder 24 is connected to slider 21 and moves in unison therewith. A solid core 51 may be connected to end portion 50 and also consists of a material having high magnetic loss. The free end of core 51 is spaced from slider 21. It will therefore readily be seen that core 51 and shell 24 will damp out the unwanted resonant frequencies which may exist in the unused or free portions of inductors 10 and 11.

Figure 4:
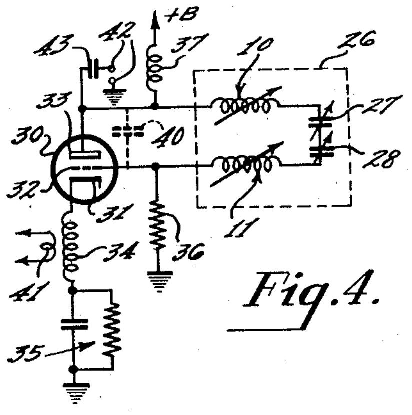
Figure 4 is an equivalent circuit diagram of the inductance structure of Figure 1 which is shown connected to an oscillation generator.

Figure 4 illustrates an oscillator generator wherein dotted box 26 indicates diagrammatically the structure of Figure 1. Variable inductors 10 and 11 correspond to those of Figures 1 and 2. Capacitors 27 and 28 represent the capacitance between slider 21 and inductors 10 and 11 respectively. The capacitors 27, 28 have been shown variable because these capacitances will decrease when slider 21 moves over tapered rod 13.

The variable inductance structure 26 shown in Figure 4 forms part of an oscillation generator including triode 30 having a cathode 31, control grid 32 and an anode 33. Cathode 31 is grounded through choke coil 34 and bias network 35 consisting of a capacitor and a resistor connected in parallel. Control grid 33 is grounded through a grid leak resistor 36. Anode 33 is connected to a suitable voltage supply indicated at +B through choke coil 37. Inductors 10 and 11 are connected respectively to anode 33 and control grid 32.

The oscillator of Figure 4 may be considered to operate in the manner of a Colpitts oscillator. Capacitor 40 shown in dotted lines between anode 33 and control grid 32 indicates the inter-electrode capacitances of the tube. Thus, the capacitor 40 includes the anode-grid capacitance, the anode-cathode capacitance as well as the grid-cathode capacitance of tube 30. Inductance structure 26 in combination with capacitor 40 represent a parallel resonant circuit. Its resonant frequency is determined by the position of slider 21 in the manner previously described.

The oscillatory output wave may be derived, for example, from inductor 41 inductively coupled to choke coil 34 in the cathode circuit. Alternatively, the output wave may be derived from anode 33 through output terminals 42, one of which is grounded while the other one is coupled to the anode through coupling capacitor 43. It is, of course, also feasible to derive an output wave from capacitive pickup 23 as shown in Figures 1 and 2.

Figure 5:
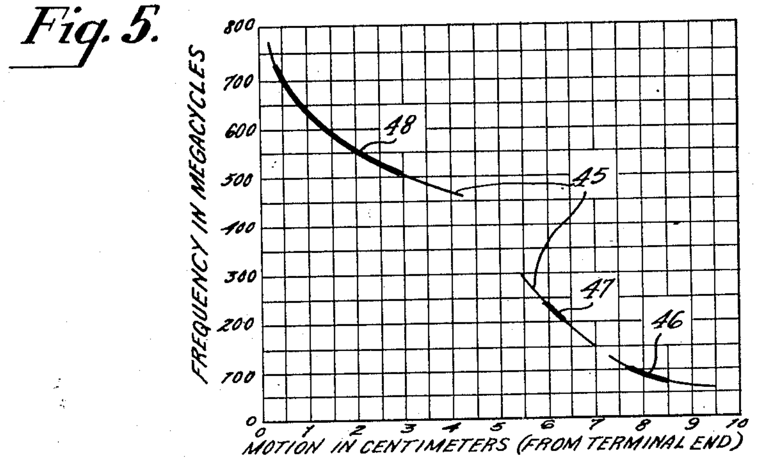
Figure 5 is a graph showing curves illustrating by way of example the relation between the resonant frequency of a structure in accordance with Figures 1 to 4 with respect to the motion of a movable slider thereof.

Figure 5 illustrates curves 45 illustrating the frequency of the oscillator of Figure 4 with respect to the motion of slider 21 from terminals 14. The frequency range is between approximately 50 and over 700 mc. During a portion of the undesired frequency range the oscillator does not oscillate due to resonances in coils 37 and 34. The heavy portions 46, 47 and 48 on curves 45 indicate the desired frequency ranges. Thus, if the oscillator of Figure 4 is used in a superheterodyne receiver and if the intermediate frequency is 25 mc., the oscillator range should be 79 to 113, 199 to 241 and 515 to 725 mc. as shown in Figure 5 in order to cover the three television bands 54 to 88, 174 to 216 and 490 to 700 mc. Inductors 10 and 11 may have a length of between 4 and 6 inches and an inner diameter of one-quarter inch to cover this frequency range.

The oscillator of Figure 4 has the advantage that it is not necessary to provide a physical capacitor between the terminals 14, that is, between anode 33 and grid 32. A further advantage is that the terminals may be brought out close together so that the leads which connect the inductance structure to tube 30 may be made very short. This, in turn, reduces stray inductance and stray capacitance. The inductance range is extremely wide and the over-all length of inductance 10 and 11 may be very short. This is due to the fact that the full length of the inductors is utilized for the low-frequency end of the tuning range corresponding to the high inductance of the structure. At the high frequency end of the tuning range the capacitance of capacitors 27, 28 is reduced, thereby to increase the effective tuning range. Furthermore, no shunt capacity exists between terminals 14 so that the structure of the invention may readily be used with other high-frequency circuits.

It is to be understood that rods 13 may be omitted in which case terminals 14 would be connected directly to ribbons 16. Cylinders 24 may also be omitted, if desired.

What is claimed is:

1. A variable resonant structure for varying the tuning response of an electrical circuit comprising a pair of inductors, each having a substantially straight support of insulating material, a metallic helical ribbon disposed about each of said supports, each of said ribbons having a pitch varying along its length in a predetermined manner, a dielectric layer disposed about each of said ribbons, a terminal connected to one end of each of said ribbons, a metallic slider surrounding a short portion of the axial length of each of said inductors and spaced therefrom by said dielectric layer to form a capacitance between each inductor and said slider, said slider being movable along said inductors to vary the inductance existing between said terminals and said slider, a high loss element disposed about each of said layers, said elements being disposed between the other end of each of said inductors and said slider and being secured to said slider, a radio signal pickup element coupled to one of said inductors, and capacitive means connected between said terminals.

2. A variable inductance structure for varying the tuning response of an electrical circuit comprising a pair of inductors, each having a substantially straight support of insulating material, a metallic ribbon disposed spirally about each support, a metallic rod one end of which is connected to each of said ribbons, a terminal secured to the other end of each of said rods, said rods being tapered toward said terminals, each of said ribbons having a pitch varying along its length in a predetermined manner, a dielectric layer disposed about each ribbon, a single metallic slider completely enclosing a short axial length of each of said layers to form a capacitance between said slider and each of said inductors, said slider being movable with respect to said inductors to vary the inductance existing between said terminals and said slider and wherein the capacitance between said slider and said rods is varied when said slider moves over said rods, circuit connections coupled to said terminals, and a radio signal pickup element coupled to at least one of said inductors.

3. A variable inductance structure for varying the tuning response of an electrical circuit comprising a pair of inductors, each consisting of a metallic ribbon disposed spirally about a cylindrical surface, a terminal secured to one end of each of said ribbons, each of said ribbons having a width and a pitch which is largest adjacent its terminal and which decreases towards its free end, a dielectric layer disposed about each of said ribbons, a single metallic slider enclosing a short axial length of each of said inductors to form a capacitance between said slider and each of said inductors, said slider being movable with respect to said inductors to vary the inductance existing between said terminals and said slider, a shell surrounding the free end portion of each of said ribbon and secured to said slider, and a core of high-loss magnetic material secured to said shell and disposed within said free end portion of each of said ribbons, thereby to damp out unwanted resonant frequencies which may exist in said free end portions.

4. A variable inductance structure for varying the tuning response of an electrical circuit comprising a pair of inductors, each consisting of a metallic ribbon disposed spirally about a cylindrical surface, a terminal secured to one end of each of said ribbons, each of said ribbons having a width and a pitch which is largest adjacent its terminal and which decreases towards its free end, a dielectric layer disposed about each of said ribbons, a single metallic slider enclosing a short axial length of each of said inductors to form a capacitance between said slider and each of said inductors, said slider being movable with respect to said inductors to vary the inductance existing between said terminals and said slider, a shell surrounding the free end portion of each of said ribbons, said shell having a closed end portion and being secured to said slider and movable therewith, said shell consisting of a high magnetic loss material, and a core of high-loss magnetic material secured to said shell and disposed within said free end portion of each of said ribbons, thereby to damp out unwanted resonant frequencies which may exist in said free end portions.

5. A variable inductance structure for varying the tuning response of an electrical circuit, comprising a pair of inductors each having a substantially straight support of insulating material, a metallic ribbon disposed spirally about each support, a terminal secured to one end of each of said ribbons, each of said ribbons having a width and a pitch which is largest near its terminal and which decreases towards its other end, a dielectric layer disposed about each of said ribbons, a single metallic slider completely enclosing a short axial length of each of said layers to form a capacitance between said slider and each of said inductors, said slider being movable with respect to said inductors to vary the inductance existing between said terminals and said slider, a high loss element disposed about each of said layers, said elements being disposed between the other end of each of said inductors and said slider and being secured to said slider, and circuit connections coupled to said terminals.

6. A variable inductance structure for varying the tuning response of an electrical circuit comprising a pair of inductors, each consisting of a metallic rod and of a metallic ribbon electrically connected to said rod and disposed spirally about a predetermined elongated surface, each of said ribbons having a width and a pitch which is largest adjacent said rod and which decreases towards its free end, a terminal secured to the free end of each of said rods, each of said rods being tapered toward said terminals, a dielectric layer disposed about each of said rods and about each of said ribbons, a single metallic slider enclosing a short axial length of each of said inductors to form a capacitance between said slider and each of said inductors, said slider being movable with respect to said inductors and to said rods to vary the inductance existing between said terminals and said slider and the capacitance between said slider and said rods, and an electrical circuit connected to said terminals.

EUGENE O. KEIZER.

References Cited in the file of this patent

UNITED STATES PATENTS

| Number | Name | Date |
|---|---|---|
| 2,222,387 | Wheeler et al. | Nov. 19, 1940 |
| 2,335,969 | Schaper | Dec. 7, 1943 |
| 2,363,101 | Van Der Heem | Nov. 21, 1944 |
| 2,423,824 | Beetham | July 15, 1947 |
| 2,477,693 | Guanella | Aug. 2, 1949 |